United States Patent
Regier

(10) Patent No.: US 7,339,418 B2
(45) Date of Patent: Mar. 4, 2008

(54) DIFFERENTIAL FILTER TOPOLOGY WITH DIELECTRIC ABSORPTION CANCELLATION FOR A DATA ACQUISITION DEVICE

(75) Inventor: Christopher G. Regier, Austin, TX (US)

(73) Assignee: National Instruments Corporation, Austin, TX (US)

( * ) Notice: Subject to any disclaimer, the term of this patent is extended or adjusted under 35 U.S.C. 154(b) by 148 days.

(21) Appl. No.: 11/205,868

(22) Filed: Aug. 17, 2005

(65) Prior Publication Data

US 2006/0038611 A1 Feb. 23, 2006

Related U.S. Application Data

(60) Provisional application No. 60/602,249, filed on Aug. 17, 2004.

(51) Int. Cl.
*H03K 5/00* (2006.01)
(52) U.S. Cl. .................................. 327/552; 327/554
(58) Field of Classification Search ......... 327/551–559
See application file for complete search history.

(56) References Cited

U.S. PATENT DOCUMENTS

| | | | |
|---|---|---|---|
| 4,771,265 A * | 9/1988 | Okui et al. ............... 341/167 |
| 5,084,683 A | 1/1992 | Nicollini | |
| 5,218,319 A | 6/1993 | Takimoto | |
| RE35,379 E | 11/1996 | Nicollini | |
| 5,699,016 A * | 12/1997 | Federspiel et al. ........ 330/260 |
| 5,708,391 A | 1/1998 | Altmann et al. | |
| 5,815,051 A | 9/1998 | Hamasaki et al. | |
| 5,952,878 A | 9/1999 | Wu et al. | |
| 6,184,747 B1 | 2/2001 | Helgeson et al. | |
| 6,294,945 B1 | 9/2001 | Regier et al. | |
| 6,429,734 B1 | 8/2002 | Wang et al. | |
| 6,552,611 B2 | 4/2003 | Yamamoto | |
| 6,642,672 B2 | 11/2003 | Hu et al. | |
| 6,753,730 B2 | 6/2004 | Yamamoto | |
| 6,903,602 B2 | 6/2005 | Cusinato | |
| 7,173,230 B2 * | 2/2007 | Charbon ................. 250/214 A |

* cited by examiner

*Primary Examiner*—Dinh T. Le
(74) *Attorney, Agent, or Firm*—Meyertons Hood Kivlin Kowert & Goetzel, P.C.; Jeffrey C. Hood

(57) ABSTRACT

In one embodiment, a differential filter is configured using a differential operational amplifier (op-amp) with two feedback RC networks, each RC network coupled between a respective input and a respective output of the op-amp. Two capacitive elements may each provide mid-band positive feedback from a respective output of the op-amp to the midpoint of a respective corresponding resistive element, where each resistive element is coupled to a respective input of the op-amp. The mid-band positive feedback may operate to convert a first-order response of the filter to a second-order response. In one set of embodiments, dielectric absorption (DA) cancellation may be implemented with positive RC feedback from a divided version of a respective one of the op-amp outputs. For cascaded filters, DA cancellation may be implemented with positive RC feed-forward. Transistors coupled across the feedback RC networks may be used to disable the filter, decoupling the filter from other circuit components when the filter is not in use.

23 Claims, 4 Drawing Sheets

DIFFERENTIAL FILTER TOPOLOGY WITH DIELECTRIC ABSORPTION CANCELLATION FOR A DATA ACQUISITION DEVICE

PRIORITY CLAIM

This application claims benefit of priority of provisional application Ser. No. 60/602,249 titled "Differential Filter Topology with Dielectric Absorption Cancellation for a Data Acquisition Device" and filed Aug. 17, 2004, which is hereby incorporated by reference as though fully and completely set forth herein.

BACKGROUND OF THE INVENTION

1. Field of the Invention

This invention relates generally to measurement and data acquisition systems and, more particularly, to filter design.

2. Description of the Related Art

Scientists and engineers often use measurement systems to perform a variety of functions, including measurement of a physical phenomena or unit under test (UUT), test and analysis of physical phenomena, process monitoring and control, control of mechanical or electrical machinery, data logging, laboratory research, and analytical chemistry, to name a few examples.

A typical measurement system comprises a computer system with a measurement device or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a GPIB (General-Purpose Interface Bus), a VXI (VME extensions for Instrumentation) bus, a serial port, parallel port, or Ethernet port of the computer system. Optionally, the measurement system includes signal conditioning devices which receive field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a UUT.

Measurement systems, which may also be generally referred to as data acquisition systems, may include the process of converting a physical phenomenon (such as temperature or pressure) into an electrical signal and measuring the signal in order to extract information. PC-based measurement and data acquisition (DAQ) systems and plug-in boards are used in a wide range of applications in the laboratory, in the field, and on the manufacturing plant floor, among others.

Typically, in a measurement or data acquisition process, analog signals are received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis. Then, the computer system may generate digital signals that are provided to one or more digital to analog converters (DACs) in the DAQ device. The DACs may convert the digital signal to an output analog signal that is used, e.g., to stimulate a UUT.

Multifunction DAQ devices typically include digital I/O capabilities in addition to the analog capabilities described above. Digital I/O applications may include monitoring and control applications, video testing, chip verification, and pattern recognition, among others. DAQ devices may include one or more general-purpose, bidirectional digital I/O lines to transmit and received digital signals to implement one or more digital I/O applications.

Generally, signals that are being measured using a DAQ system are first routed from a particular channel via a multiplexer. The signals then enter an instrumentation amplifier, typically a programmable gain instrumentation amplifier (PGIA). The PGIA typically applies a specified amount of gain to an input signal, which raises the signal to a higher level and ensures proper A/D conversion. The amplifier may also convert differential input signals applied to the DAQ board to a single-ended output so that the ADC can correctly digitize the data. Rather than being routed directly to an ADC, the output of a PGIA is typically sent to a filter, or filter bank, and the filtered output is then provided to the ADC for conversion. The ADC may then sample and hold the signal until the signal is digitized and placed into a FIFO buffer on the board. In the FIFO, the digitized signal is ready to be transferred from the board to computer memory via the PC bus for further processing.

Filtering of the output of the PGIA is generally performed to reduce noise, since noise typically results in measurement uncertainty. Since many of the new generation ADCs feature differential inputs, differential filtering is preferred. One way to obtain differential filtering if the input signal is fully differential is to use a pair of single-ended filters. This method typically suffers from additional noise from two op-amps being added to the signal. There may also be a need for common-mode level shifting, which generally requires additional circuitry, thus further increasing the potential for noise. In case of single-ended input signals the need arises for a single-ended-to-differential converter, either following a single-ended filter or preceding a pair of single-ended filters. In either case, the components of the single-ended-to-differential converter typically add more noise to the signal, partially defeating the original purpose of the filter itself.

Differential active filters have typically been built around differential op-amps. In one set of applications, feedback capacitors are added in parallel with the feedback resistors. This typically provides filtering, but only of first order, which is insufficient for many applications. To achieve higher order filtering, a differential version of the "multi-feedback" filter has been employed in an array of applications. This method however includes adding extra noise-generating resistors to the circuit in order to obtain the second filter pole. Such resistors would be unnecessary in a single-pole filter. A differential passive (LCR) filter may provide an alternative solution, however the nonlinearity of the inductors that may be comprised in a passive filter could result in additional problems, as well as potentially increasing the filter's susceptibility to magnetic noise coupling. In addition, a passive filter offers no provision for common-mode level shifting.

Therefore, a differential filter that can accomplish single-ended to differential conversion, common-mode level shifting, and second-order filtering with a minimum of noise-generating components is highly desirable.

It is sometimes desirable to have a choice of multiple filter cutoff frequencies. For example, it may be desirable to be able to choose a wide bandwidth for fastest settling or a low bandwidth for minimum noise. In such instances, and others as well, there may be multiple stages or instances of filtering, where some of the stages or instances are unused. To avoid undesired coupling between stages in such cases, the unused stages of filters should be disabled. It is therefore desirable to have a means to disable the output of a differential filter.

It is also sometimes the case that a filter does not settle as well as would be expected due to the presence of dielectric absorption (DA) in the capacitors used in the filter. It is therefore desirable to provide a means by which the DA-induced errors of a filter stage can be compensated.

Other corresponding issues related to the prior art will become apparent to one skilled in the art after comparing such prior art with the present invention as described herein.

SUMMARY OF THE INVENTION

In one embodiment, a first-order filter is configured using a differential op-amp. A respective feedback RC network may be coupled between each respective input and corresponding respective output of the op-amp. Each RC feedback network may comprise a respective resistor and a respective capacitor. An additional respective capacitor may be coupled from each respective output of the op-amp to a midpoint of a respective corresponding resistive element, to provide mid-band positive feedback. In one set of embodiments, each resistive element may comprise a first resistor and a second resistor. The additional respective capacitors may operate to convert the first-order response of the filter to a second-order response.

In one set of embodiments, a respective transistor coupled across a corresponding respective feedback RC network of a filter may be used to disable the output of the filter. Each transistor, for example a BJT, may be switched on or off by applying a DC control voltage to the base of the transistor through a respective resistor coupled to the base of the transistor. The differential output of the filter may be disabled by turning on the transistors.

In one embodiment dielectric absorption (DA) cancellation for a filter may be implemented with positive RC feedback. DA cancellation for filter capacitors comprised in the feedback RC networks may be implemented with a positive RC feedback circuit coupled between a specified input terminal, for example the inverting input terminal, of the op-amp comprised in the filter and a divided version of a corresponding output terminal, in this case the inverting output terminal, of the op-amp. In one set of embodiments, a second RC network may be coupled between the other input terminal (that is, the input terminal not coupling to the positive RC feedback circuit) of the op-amp and ground, operating to reduce sensitivity to input common-mode (CM) variation.

In embodiments where two filters are cascaded, that is, where the outputs of the first filter are coupled to corresponding inputs of a second filter, DA cancellation for the second filter may be achieved with a positive RC feed-forward circuit. The positive RC feed-forward circuit may be coupled between a designated input terminal, for example the non-inverting input terminal, of the op-amp comprised in the second filter, and the divided version of the corresponding output terminal, in this case the inverting output terminal, of the op-amp comprised in the first filter. In one embodiment, an additional RC network may be configured at the other input terminal (that is, the input terminal not coupling to the RC feed-forward circuit) of the op-amp comprised in the second filter, to reduce CM sensitivity.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
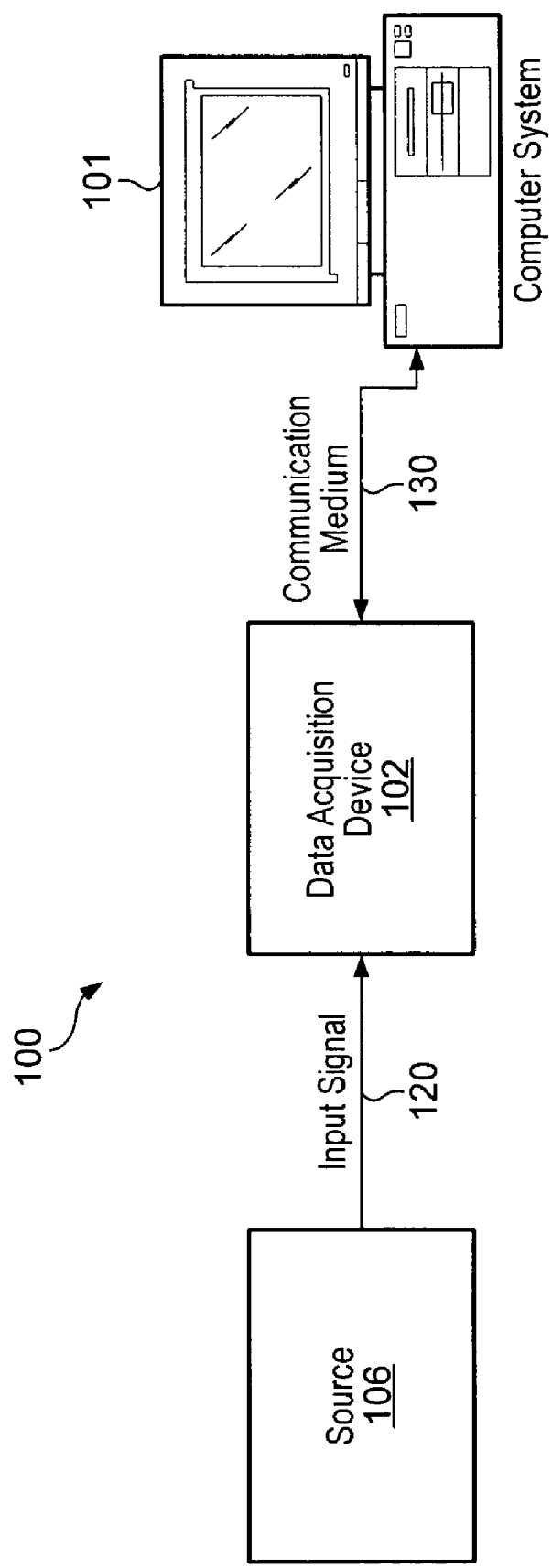
FIG. 1 is a diagram of one embodiment of a computer-based measurement system or data acquisition system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE PREFERRED EMBODIMENTS

FIG. 1 is a diagram of one embodiment of a computer-based measurement system or data acquisition system 100. The data acquisition system 100 may comprise a computer system 101, which may be coupled to a measurement device, referred to as data acquisition (DAQ) device 102, through a communication medium 130. The DAQ device 102 may be an internal card or board coupled to a bus, e.g., a Peripheral Component Interconnect (PCI), PCI Express, Industry Standard Architecture (ISA), or Extended Industry Standard Architecture (EISA) bus, but is shown external to the computer 101 for illustrative purposes. The measurement device or DAQ device 102 may also be an external device coupled to the computer system 101. In this embodiment, the communication medium 130 may be a serial bus, such as USB, IEEE 1394, PXI bus, Ethernet, or a proprietary bus, or a parallel bus such as GPIB or others. It is noted that the communication medium 130 may be a wired or wireless communication medium.

The DAQ device 102 may be coupled to an external source 106, such as an instrument, sensor, transducer, or actuator from which the DAQ device 102 may receive an input signal 120, e.g., an analog input such as sensor data. In one example, the external source 106 may be a temperature sensor, which is comprised in a unit under test (UUT). In this example, the DAQ device 102 may receive temperature reading from the temperature sensor and convert the analog data to digital form to be sent to the computer system 101 for analysis. Additionally, the DAQ device 102 may receive a digital input, e.g., a binary pattern, from the external source 106 (e.g., a UUT). Furthermore, the DAQ device 102 may also produce analog or digital signals, e.g., for stimulating the UUT.

The computer system 101 may be operable to control the DAQ device 102. For example, the computer system 101 may be operable to direct the DAQ device 102 to perform an acquisition, and may obtain data from the DAQ device 102 for storage and analysis therein. Additionally, the computer system 101 may be operable to send data to the device 102 for various purposes, such as for use in generating analog signals used for stimulating a UUT.

The computer system 101 may include a processor, which may be any of various types, including an x86 processor, e.g., a Pentium™ class, a PowerPC™ processor, a CPU from the SPARC™ family of RISC processors, as well as others. Also, the computer system 101 may also include one or more memory subsystems (e.g., Dynamic Random Access Memory (DRAM) devices). The memory subsystems may collectively form the main memory of computer system 101 from which programs primarily execute. The main memory may be operable to store a user application and a driver software program. The user application may be executable by the processor to conduct the data acquisition/generation process. The driver software program may be executable by the processor to receive data acquisition/generation tasks from the user application and program the DAQ device 102 accordingly.

Figure 2:
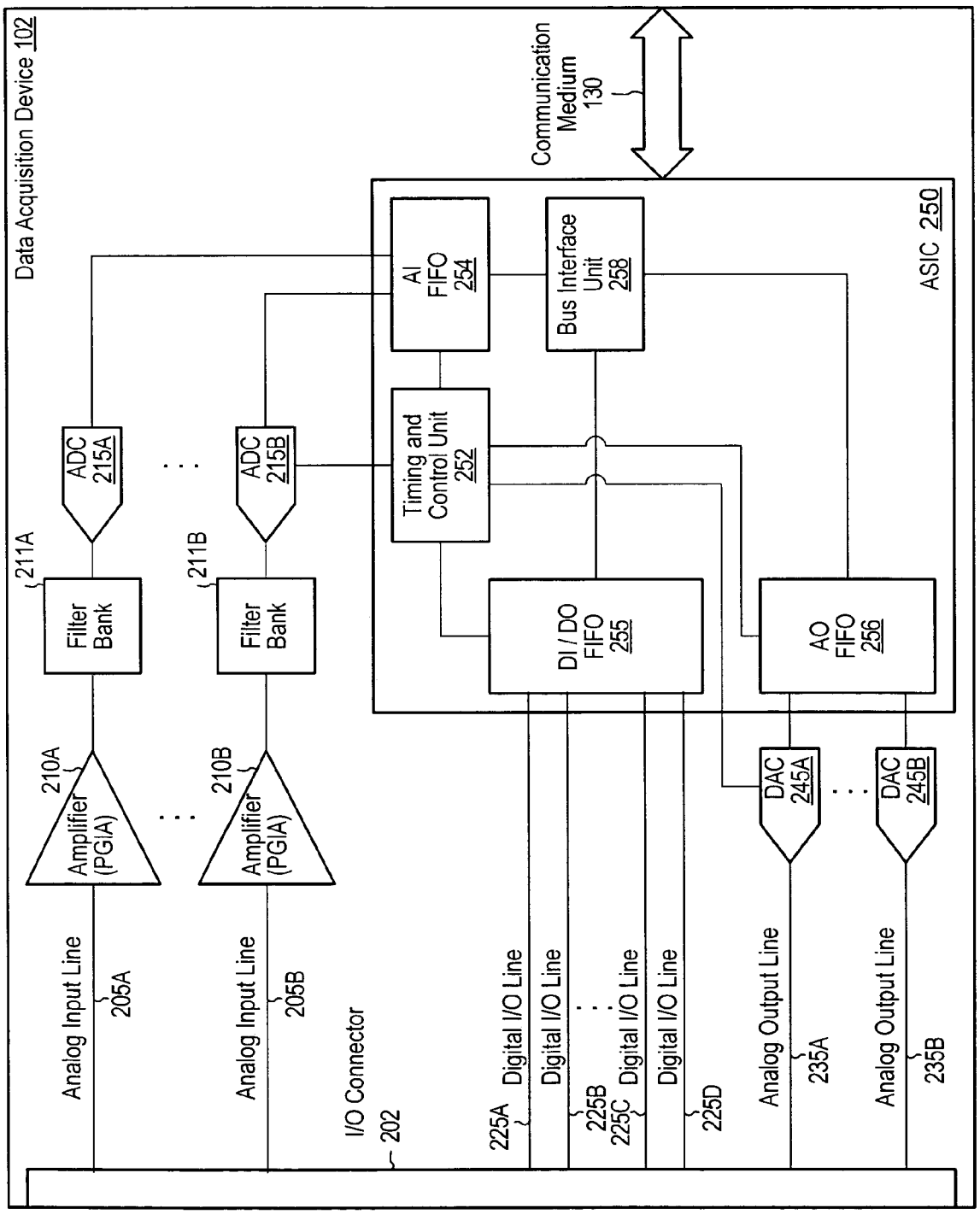
FIG. 2 is a block diagram of one embodiment of a data acquisition (DAQ) device.

FIG. 2 is a block diagram of one embodiment of a data acquisition (DAQ) device 102. Components that correspond to those shown in FIG. 1 are numbered identically for simplicity and clarity. As described above, the DAQ device 102 may be an internal device coupled to, e.g., a PCI bus, or may also be an external device coupled to the computer system 101 via a serial bus, e.g., PXI bus, or a parallel bus, e.g., a GPIB. The DAQ device 102 may be a board or a module comprising one or more integrated circuits (ICs) or the DAQ device 102 may be an IC, for example, a mixed-signal IC.

The DAQ device 102 may comprise an input/output (I/O) connector 202, analog input lines 205A and 205B, amplifiers 210A and 210B, filter banks 211A and 211B, analog-to-digital converters (ADCs) 215A and 215B, digital I/O lines 225A, 225B, 225C, and 225D, analog output lines 235A and 235B, a timing and data control IC (e.g., application-specific integrated circuit (ASIC) 250), digital-to-analog converters (DACs) 245A and 245B, and communication medium 130. It should be noted that the components described with reference to FIG. 2 are meant to be exemplary only, and are not intended to limit the invention to any specific set of components or configurations. For example, in various embodiments, one or more of the components described may be omitted, combined, modified, or additional components included, as desired.

The DAQ device 102 may receive and send digital and/or analog data via the input and output lines of the I/O connector 202. For example, the I/O connector 202 may be coupled to a signal source (e.g., source 106 of FIG. 1) comprised in a UUT to receive analog signals. The I/O connector 202 may comprise analog input lines 205A and 205B, which may convey the received analog signals to amplifier 210A and 210B. It is noted however that in other embodiments the DAQ device 102 may comprise any number of analog input lines, e.g., three or more analog input lines.

In one embodiment, amplifiers 210A and 210B may be programmable gain instrumentation amplifiers (PGIAs). PGIAs are typically differential amplifiers having a high input impedance and a gain that is adjustable through the variation of a single resistor. The amplifier 210A may apply a specified amount of gain to the input signal to ensure proper analog-to-digital conversion. Also, PGIAs may convert differential input signals into single-ended outputs, which may be needed for the ADC (e.g., ADC 215A) to correctly digitize the data. It is noted however that in other embodiments amplifier 210A and/or amplifier 210B may be other types of amplifiers typically used in data acquisition devices. It is also noted that DAQ device 102 may comprise any number of amplifiers, e.g., three or more amplifiers.

The output of amplifier 210A may be connected to filter bank 211A, from which filtered signals may be output and provided to ADC 215A, which may digitize the analog signals. ADCs are devices that convert a continuously varying (analog) signal into a discrete (digital) signal. The resolution of the ADC typically indicates the number of discrete values it can produce. For example, if the ADC has an eight-bit resolution, the ADC may be able to encode an analog input to one of 256 discrete values (since $2^8=256$). Each discrete value is derived by sampling the analog signal at a predetermined rate (i.e., the sampling rate of the ADC). More specifically, the signal values at particular time intervals are measured and stored. An ADC typically includes a sample and hold circuit, which holds the input value constant during the time the ADC performs the analog-to-digital conversion, since the ADC cannot make an instantaneous conversion. It is noted however that in other embodiments the DAQ device 102 may comprise any number of ADCs, for example, the DAQ device 102 may include a single ADC or four ADCs.

After the signals are digitized, the ADC 215A may send the digital signals to the ASIC 250. In one embodiment, the ASIC 250 may be a mixed-signal ASIC, which may be configured to perform the timing and data control functions for the DAQ device 102. It is noted however that in other embodiments other types of timing and data control ICs may be used. The ASIC 250 may include a timing and control unit 252, an analog input (AI) first-in first-out (FIFO) buffer 254, a digital input (DI)/digital output (DO) FIFO buffer 255, an analog output (AO) FIFO buffer 256, and a bus interface unit 258. It is noted that in other embodiments one or more of the components described may be omitted, combined, modified, or additional components included, as desired.

When the ASIC 250 receives the digitized signals, the data may be stored in AI FIFO buffer 254. FIFO buffers are storage devices that output the stored data in the order the data was received. After being stored in the AI FIFO buffer 254, the digitized data may be sent to the bus interface unit 258. In one embodiment, the bus interface unit 258 may be coupled to the communication medium 130 for sending data to and receiving data from a computer system (e.g., computer system 101 of FIG. 1). The bus interface unit 258 may be operable to implement the protocol associated with the type of bus coupled to the DAQ device 102. As described above, exemplary buses coupled to the bus interface unit 258 include a PCI, PCI Express, USB, IEEE 1394, PXI bus, or Ethernet, among others. In one embodiment, the bus interface unit 258 may send the digitized data to the computer system 101 for storage and analysis of the data.

As described above, the computer system (e.g., computer system 101 of FIG. 1) may provide digital signals to the DAQ device 102 to stimulate a UUT. In one embodiment, the digital signals may need to be converted to analog form to stimulate the UUT. Therefore, in this embodiment, after the ASIC 250 of DAQ device 102 receives the digital signals and stores them in AO FIFO buffer 256, the digital data may be transmitted to DAC 245A to be converted to analog form. DACs are devices that convert discrete (digital) signals into continuously varying (analog) signals. For example, if an analog signal was initially converted to digital form, a DAC may be able to reproduce the analog signal if provided with the digital data. However, according to the Nyquist sampling theorem, reproduction is typically only possible if the sampling rate is higher than twice the frequency of the highest output frequency to be reproduced. It is noted that the DAQ device 102 may comprise any number of DACs, for example, other embodiments may include a single DAC or three DACs. After the digital data is converted to analog form, the analog signals may be sent to the I/O connector 202 via the analog output line 235A.

In one embodiment, digital signals may be received at the I/O connector 202. The received digital signals may be sent to the ASIC 250 via one or more of the digital I/O lines 225A-D. In one embodiment, the digital I/O lines 225A-D are general-purpose, bidirectional digital I/O lines, which may be configured to send and receive digital data. When the ASIC 250 receives the digital signals, the data may be stored in the DI/DO FIFO buffer 255. After being stored in the DI/DO FIFO buffer 255, the digital data may be sent to the bus interface unit 258, which may convey the digital data to the computer system 101, as described above. It is noted that digital data received via the bus interface unit 258 may also be stored in DI/DO FIFO buffer 255 before being sent to the I/O connector 202 via one or more of the digital I/O lines 225A-D.

The ASIC 250 may include the timing and control unit 252 to provide timing and control and data management functions for the DAQ device 102 during, e.g., a data acquisition process. The timing and control unit may comprise one or more counter/timers, which may be used in various applications, including counting the occurrences of a digital event, digital pulse timing, and generating square waves and pulses. The timing and control unit 252 may be coupled to one or more of the FIFO buffers (e.g., AO FIFO buffer 256) of the DAQ device 102 to provide timing and control signals for storing data received from, e.g., the bus interface 258 or the ADC 215A, and for sending data to, e.g., DAC 245A. Furthermore, the timing and control unit 252 may be coupled to the ADCs (e.g., ADC 215A) and DACs (e.g., ADC 245A) of the DAQ device 102 to provide timing and control signals for performing the data conversion functions that may be necessary in a data acquisition process.

In one embodiment, the timing and control unit 252 and/or the bus interface unit 258 may be implemented in hardware. In a further embodiment, the timing and control unit 252 and/or the bus interface unit 258 may be implemented in software. In yet another embodiment, the timing and control unit 252 and/or the bus interface unit 258 may be implemented in both hardware and software. In one embodiment, the functionality described above with regard to the timing and control unit 252 and/or the bus interface unit 258 may be distributed across multiple components. In various embodiments, this type of functional distribution may also apply to other components described herein.

Figure 3:
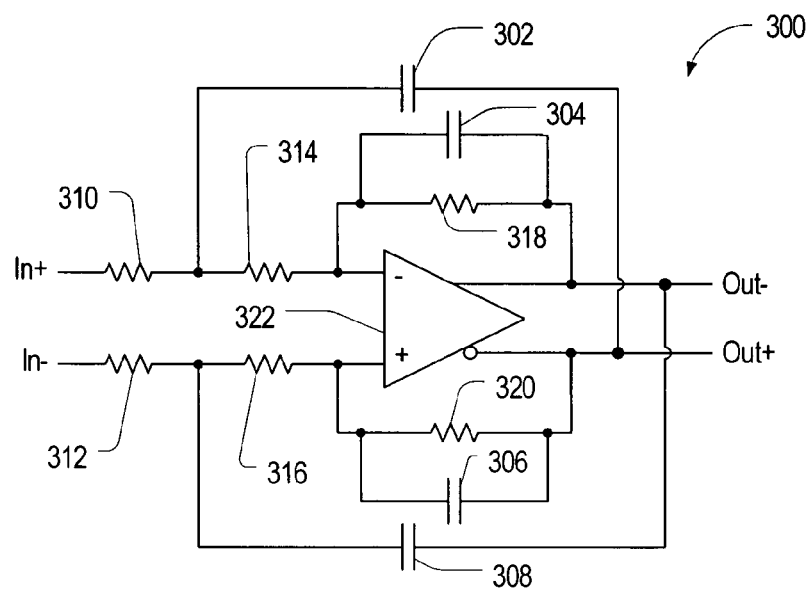
FIG. 3 shows one embodiment of a differential-in to differential-out second-order low-pass filter.

FIG. 3 shows one embodiment of a differential-in to differential-out second-order low-pass filter 300 that may be used in filter bank 211A and/or filter bank 211B. Output common-mode level may be set independently of input common-mode level, making it possible to use the circuit for single-ended to differential conversion as well. In one embodiment, filter circuit 300 is configured with a first order filter based on differential operational amplifier (op-amp) 322 with two feedback RC networks comprising resistor 318 and capacitor 304, and resistor 320 and capacitor 306, respectively. Additional capacitors 302 and 308 may provide mid-band positive feedback to a midpoint of corresponding resistive elements, which comprise resistors 310 and 314, and 312 and 316, respectively. By configuring filter circuit 300 with mid-band positive feedback as shown, capacitors 302 and 308 may operate to convert the first-order response to a second-order response. It should be noted that "midpoint of corresponding resistive elements", as used herein, does not necessarily refer to a literal midpoint of the resistive elements, but to a node configured in between two resistors comprising a resistive element. In other words, for example, resistors 310 and 314 may not need to have substantially matching values. In preferred embodiments, the value of resistor 310 may substantially match the value of resistor 312, and the value of resistor 314 may substantially match the value of resistor 316, however.

Figure 4:
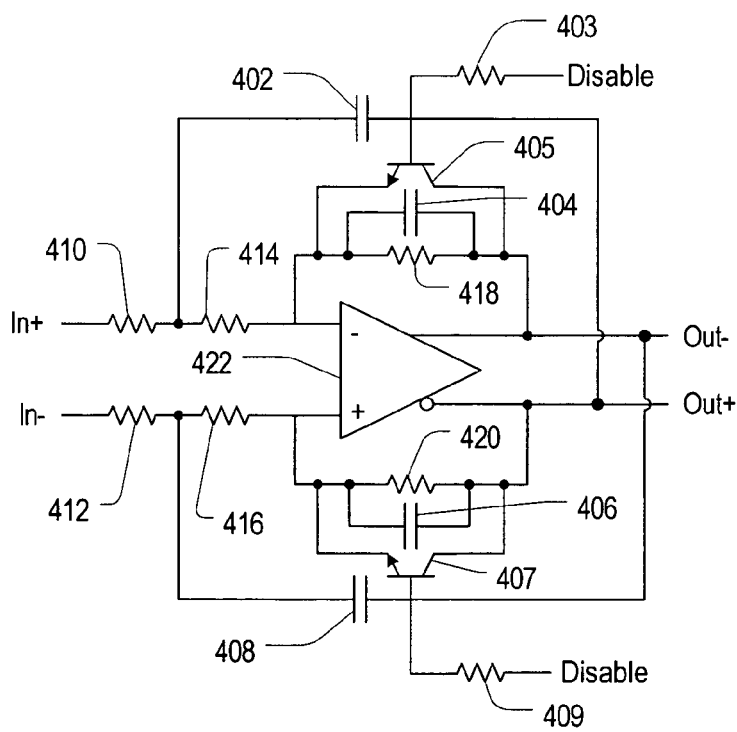
FIG. 4 shows one embodiment of a differential-in to differential-out low-pass filter with a method for disabling the output of the filter.

FIG. 4 shows an alternate embodiment of differential-in to differential-out second-order low-pass filter 300, with a method for disabling the output of filter circuit 300 in order to avoid coupling filter circuit 300 to other circuits when not in use. Transistors 405 and 407 may be coupled across feedback resistors 418 and 420, respectively, as shown, and may be switched on or off by applying a DC control voltage to the transistor bases through resistors 403 and 409, respectively. The output of the filter circuit, that is, the differential output comprising Out− and Out+, may be disabled by turning on transistors 405 and 407. Use of transistors 405 and 407 for enabling/disabling the filter output may be preferred in a differential-input context, where the op-amp common-mode voltage is constant. While transistors 405 and 407 shown in FIG. 4 are bipolar junction transistors (BJTs), those skilled in the art will appreciate that alternate components may be used to perform the disabling of the output of the filter when not in use, and the disabling circuit is in no way limited to the use of BJTs. It should also be noted that in one set of embodiments, transistors 405 and 407 may similarly be configured to disable and/or enable first-order filters. In such embodiments, capacitors 402 and 408 may be omitted from the circuit shown in FIG. 4.

Figure 5:
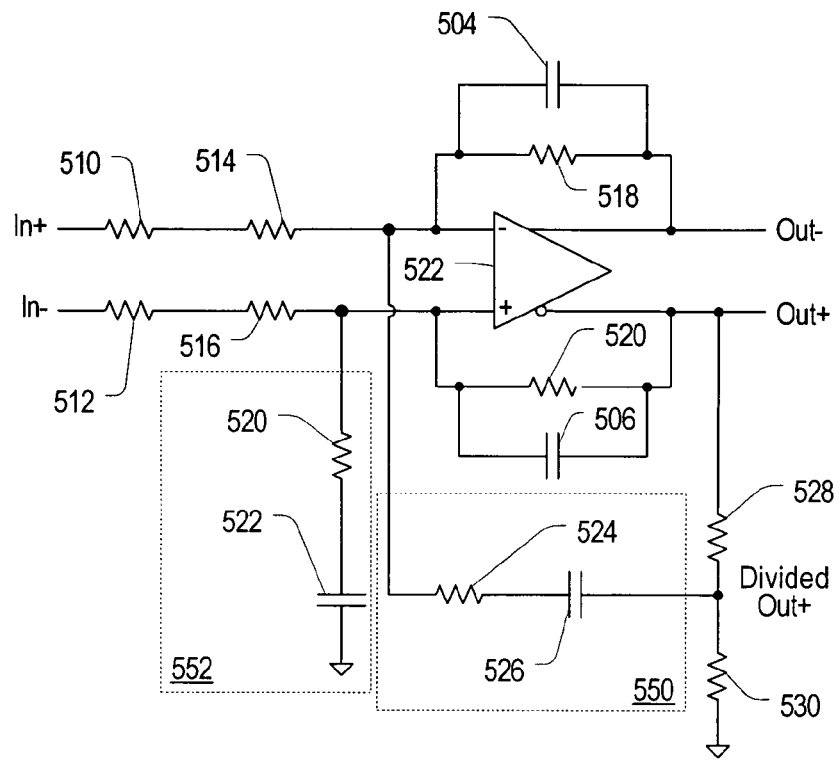
FIG. 5 shows one embodiment of a differential-in to differential-out low-pass filter with dielectric absorption cancellation for the filter capacitors implemented with positive RC feedback.

FIG. 5 shows one embodiment of a differential-in to differential-out low-pass filter with dielectric absorption (DA) cancellation for the filter capacitors implemented with positive RC feedback. In this embodiment, DA cancellation for filter capacitors 504 and 506 may be implemented with a positive RC feedback circuit 550 coupled between the inverting input terminal of op-amp 522 and a divided version of output Out+. Positive RC feedback circuit 550 may comprise resistor 524 and capacitor 526, while resistors 528 and 530 may constitute the voltage divider circuit dividing down output Out+. In one set of embodiments, a second RC network 552 may be coupled between the non-inverting input of op-amp 522 and ground, operating to reduce sensitivity to input common-mode (CM) variation. While the DA cancellation for the filter capacitors is shown for a first-order filter in FIG. 5, those skilled in the art will appreciate that DA cancellation may similarly be implemented for other embodiments of differential-in to differential-out low-pass filters, for example for filter 300 containing the additional capacitors providing mid-band positive feedback.

Figure 6:
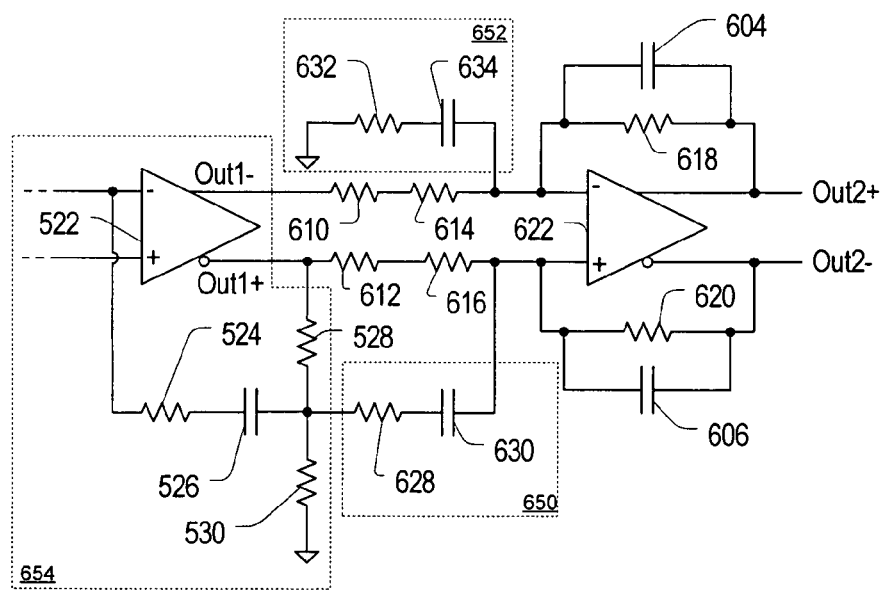
FIG. 6 shows one embodiment of a differential-in to differential-out low-pass filter with dielectric absorption cancellation for the filter implemented with positive RC feed-forward.

In embodiments where two filters are cascaded, DA cancellation for the second filter may be achieved with a positive feed-forward circuit. FIG. 6. shows part of the output portion of the filter of FIG. 5 (654), with the output of op-amp 522 coupled to the input of op-amp 622, which is comprised in a filter circuit similar in structure to the filter circuit of FIG. 5. FIG. 6 illustrates DA cancellation implemented with positive RC feed-forward for the second filter (built around op-amp 622). Positive RC feed-forward circuit 650 may be coupled between the non-inverting input of op-amp 622 and the same divided output of op-amp 522 to which one end of RC feed-forward circuit 550 is also coupled. RC feed-forward circuit 650 may comprise resistor 628 and capacitor 630, as shown. Again, additional RC network 652 may be configured at the other input terminal of op-amp 622 to reduce CM sensitivity, similar to RC network 552 shown in FIG. 5. It should be noted again, that while, for illustrative purposes, the DA cancellation is shown for a first-order filter in FIG. 6, those skilled in the art will appreciate that it may similarly be implemented for other embodiments of differential-in to differential-out low-pass filters, for example for second-order filters such as filter 300.

In some embodiments, multiple stages of filter 300 may be cascaded to achieve higher order filtering (for example the two-stage cascading shown in FIG. 6 with additional capacitors providing mid-band positive feedback according to the embodiment originally shown in FIG. 3). In addition, a differential op-amp may be synthesized using a pair of single-ended op-amps, where the second op-amp may be configured to invert the output signal of the first op-amp with respect to the output common-mode voltage. This may facilitate designing filter 300 based on any one of the many already available high performance single-ended op-amps, rather than having to select from a relatively small number of available differential op-amps. In embodiments where the differential op-amp is synthesized using a pair of single-ended op-amps, inaccuracy and noise in the second op-amp may only contribute common-mode error, while any differential error may be determined by the performance of the first op-amp.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

I claim:

1. A differential filter comprising:
   a differential operational amplifier (op-amp);
   a first RC network configured to couple between a first input terminal and a first output terminal of the op-amp;
   a second RC network configured to couple between a second input terminal and a second output terminal of the op-amp;
   a first resistive element configured to couple to the first input terminal of the op-amp;
   a second resistive element configured to couple to the second input terminal of the op-amp;
   a first capacitive element configured to couple between a midpoint of the first resistive element and the second output terminal of the op-amp;
   a second capacitive element configured to couple between a midpoint of the second resistive element and the first output terminal of the op-amp; and
   a first transistor having a control terminal, an input terminal, and an output terminal, wherein the input terminal of the first transistor is configured to couple to the first output terminal of the op-amp, wherein the output terminal of the first transistor is configured to couple to the first input terminal of the op-amp, and wherein the first transistor is operable to disable the first output terminal of the op-amp in response to a control signal being applied to the control terminal of the first transistor to disconnect the differential filter;
   wherein the first capacitive element and the second capacitive element enable a second-order response of the differential filter.

2. The differential filter of claim 1, wherein each resistive element comprises a respective first resistor coupled to a respective second resistor, wherein the respective midpoint of the resistive element comprises a node where the respective first resistor couples to the respective second resistor.

3. The differential filter of claim 1, further comprising:
   a second transistor having a control terminal, an input terminal, and an output terminal, wherein the input terminal of the second transistor is configured to couple to the second output terminal of the op-amp, wherein the output terminal of the second transistor is configured to couple to the second input terminal of the op-amp, wherein the second transistor is operable to disable the second output terminal of the op-amp in response to the control signal being applied to the control terminal of the second transistor.

4. The differential filter of claim 3, wherein the first transistor comprises a first bipolar junction transistor (BJT) and the second transistor comprises a second BJT.

5. The differential filter of claim 3, further comprising:
   a third resistor configured to couple to the control terminal of the first transistor; and
   a fourth resistor configured to couple to the control terminal of the second transistor;
   wherein the first transistor is operable to receive the control signal through the third resistor, and the second transistor is operable to receive the control signal through the fourth resistor.

6. The differential filter of claim 1, further comprising:
   a divider circuit configured to couple to the second output terminal of the op-amp, and operable to generate a reduced output voltage node, wherein a voltage appearing at the reduced output voltage node is a divided down version of a voltage appearing at the second output terminal of the op-amp;
   a third RC network configured to couple between the reduced output voltage node and the first input terminal of the op-amp, wherein the third RC network is operable to provide dielectric absorption (DA) cancellation for the differential filter.

7. The differential filter of claim 6, further comprising a fourth RC network configured to couple between the second input terminal of the op-amp and ground, wherein the fourth RC network is operable to reduce a sensitivity of the differential filter to input common-mode (CM) variation.

8. A differential filter comprising:
an op-amp;
a first RC network configured to couple between a first input terminal and a first output terminal of the op-amp;
a second RC network configured to couple between a second input terminal and a second output terminal of the op-amp;
a first resistive element configured to couple to the first input terminal of the op-amp;
a second resistive element configured to couple to the second input terminal of the op-amp;
a first transistor having a control terminal, an input terminal, and an output terminal, wherein the input terminal of the first transistor is configured to couple to the first output terminal of the op-amp, wherein the output terminal of the first transistor is configured to couple to the first input terminal of the op-amp, and wherein the first transistor is operable to disable the first output terminal of the op-amp in response to a control signal being applied to the control terminal of the first transistor to disconnect the differential filter.

9. The differential filter of claim 8, further comprising:
a second transistor having a control terminal, an input terminal, and an output terminal, wherein the input terminal of the second transistor is configured to couple to the second output terminal of the op-amp, wherein the output terminal of the second transistor is configured to couple to the second input terminal of the op-amp, wherein the second transistor is operable to disable the second output terminal of the op-amp in response to the control signal being applied to the control terminal of the second transistor.

10. The differential filter of claim 9 further comprising:
a divider circuit configured to couple to the second output terminal of the op-amp, and operable to generate a reduced output voltage node, wherein a voltage appearing at the reduced output voltage node is a divided down version of a voltage appearing at the second output terminal of the op-amp;
a third RC network configured to couple between the reduced output voltage node and the first input terminal of the op-amp, wherein the third RC network is operable to provide DA cancellation for the differential filter.

11. The differential filter of claim 10, further comprising a fourth RC network configured to couple between the second input terminal of the op-amp and ground, wherein the fourth RC network is operable to reduce a sensitivity of the differential filter to input CM variation.

12. The differential filter of claim 11, further comprising:
a first capacitive element configured to couple between a midpoint of the first resistive element and the second output terminal of the op-amp; and
a second capacitive element configured to couple between a midpoint of the second resistive element and the first output terminal of the op-amp;
wherein the first capacitive element and the second capacitive element enable a second-order response of the differential filter.

13. A differential filter comprising:
an op-amp;
a first RC network configured to couple between a first input terminal and a first output terminal of the op-amp;
a second RC network configured to couple between a second input terminal and a second output terminal of the op-amp;
a first resistive element configured to couple to the first input terminal of the op-amp;
a second resistive element configured to couple to the second input terminal of the op-amp;
a divider circuit configured to couple to the second output terminal of the op-amp, and operable to generate a reduced output voltage node, wherein a voltage appearing at the reduced output voltage node is a divided down version of a voltage appearing at the second output terminal of the op-amp; and
a third RC network configured to couple between the reduced output voltage node and the first input terminal of the op-amp, wherein the third RC network is operable to provide DA cancellation for the differential filter.

14. The differential filter of claim 13, further comprising a fourth RC network configured to couple between the second input terminal of the op-amp and ground, wherein the fourth RC network is operable to reduce a sensitivity of the differential filter to input CM variation.

15. A multi-stage differential filter comprising:
a first differential filter comprising:
a first op-amp;
a divider circuit configured to couple to a first output terminal of the first op-amp, and operable to generate a reduced output voltage node, wherein a voltage appearing at the reduced output voltage node is a divided down version of a voltage appearing at the first output terminal of the first op-amp; and
a second differential filter comprising:
a second op-amp;
a first RC network configured to couple between a first input terminal and a first output terminal of the second op-amp;
a second RC network configured to couple between a second input terminal and a second output terminal of the second op-amp;
a first resistive element configured to couple between the first input terminal of the second op-amp and the first output terminal of the first op-amp; and
a second resistive element configured to couple between the second input terminal of the second op-amp and a second output terminal of the first op-amp; and
a third RC network configured to couple between the reduced output voltage node and the first input terminal of the second op-amp;
wherein the third RC network is operable to provide DA cancellation for the second differential filter.

16. The multi-stage filter of claim 15, wherein the second differential filter further comprises a fourth RC network configured to couple between the second input of the second op-amp and ground;
wherein the fourth RC network is operable to reduce a sensitivity of the second differential filter to input CM variation.

17. The multi-stage filter of claim 15, wherein the second differential filter further comprises:

a first capacitive element configured to couple between a midpoint of the first resistive element and the second output terminal of the second op-amp; and a second capacitive element configured to couple between a midpoint of the second resistive element and the first output terminal of the second op-amp;

wherein the first capacitive element and the second capacitive element enable a second-order response of the second differential filter.

18. The multi-stage filter of claim 15, wherein the second differential filter further comprises:

a first transistor having a control terminal, an input terminal, and an output terminal, wherein the input terminal of the first transistor is configured to couple to the first output terminal of the second op-amp, wherein the output terminal of the first transistor is configured to couple to the first input terminal of the second op-amp, and wherein the first transistor is operable to disable the first output terminal of the second op-amp in response to a control signal being applied to the control terminal of the first transistor.

19. The differential filter of claim 18, further comprising:

a second transistor having a control terminal, an input terminal, and an output terminal, wherein the input terminal of the second transistor is configured to couple to the second output terminal of the second op-amp, wherein the output terminal of the second transistor is configured to couple to the second input terminal of second the op-amp, wherein the second transistor is operable to disable the second output terminal of the second op-amp in response to the control signal being applied to the control terminal of the second transistor.

20. The differential filter of claim 19, wherein the first transistor comprises a first BJT and the second transistor comprises a second BJT.

21. The differential filter of claim 19, further comprising:

a third resistor configured to couple to the control terminal of the first transistor; and a fourth resistor configured to couple to the control terminal of the second transistor;

wherein the first transistor is operable to receive the control signal through the third resistor, and the second transistor is operable to receive the control signal through the fourth resistor.

22. A differential filter comprising:

a differential operational amplifier (op-amp);

a first RC network configured to couple between a first input terminal and a first output terminal of the op-amp;

a second RC network configured to couple between a second input terminal and a second output terminal of the op-amp;

a first resistive element configured to couple to the first input terminal of the op-amp;

a second resistive element configured to couple to the second input terminal of the op-amp;

a first capacitive element configured to couple between a midpoint of the first resistive element and the second output terminal of the op-amp; and a second capacitive element configured to couple between a midpoint of the second resistive element and the first output terminal of the op-amp;

a divider circuit configured to couple to the second output terminal of the op-amp, and operable to generate a reduced output voltage node, wherein a voltage appearing at the reduced output voltage node is a divided down version of a voltage appearing at the second output terminal of the op-amp; and a third RC network configured to couple between the reduced output voltage node and the first input terminal of the op-amp, wherein the third RC network is operable to provide dielectric absorption (DA) cancellation for the differential filter.

23. The differential filter of claim 22, further comprising a fourth RC network configured to couple between the second input terminal of the op-amp and ground, wherein the fourth RC network is operable to reduce a sensitivity of the differential filter to input common-mode (CM) variation.

* * * * *